United States Patent
Wu et al.

(10) Patent No.: US 7,768,628 B2
(45) Date of Patent: Aug. 3, 2010

(54) CONTACT LITHOGRAPHY APPARATUS AND METHOD

(75) Inventors: Wei Wu, Palo Alto, CA (US);
Shih-Yuan Wang, Palo Alto, CA (US);
Duncan R. Stewart, Palo Alto, CA (US); R. Stanley Williams, Palo Alto, CA (US); Zhaoning Yu, Palo Alto, CA (US); Inkyu Park, Albany, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 912 days.

(21) Appl. No.: 11/548,823

(22) Filed: Oct. 12, 2006

(65) Prior Publication Data
US 2008/0087636 A1    Apr. 17, 2008

(51) Int. Cl.
*G03B 27/02*    (2006.01)
*G03B 27/42*    (2006.01)
*G03B 27/58*    (2006.01)
*G03B 27/20*    (2006.01)
*G03B 27/22*    (2006.01)
*H01L 21/00*    (2006.01)

(52) U.S. Cl. .............................. 355/78; 355/53; 355/72; 355/91; 355/104; 430/311

(58) Field of Classification Search .................. 355/78, 355/80, 81, 84–87, 91, 94, 99, 104, 118, 355/122, 132, 72–76, 53; 430/22, 311, 313, 430/322; 425/405.1, 387.1, 149; 264/293, 264/299

See application file for complete search history.

(56) References Cited

U.S. PATENT DOCUMENTS

| | | | | |
|---|---|---|---|---|
| 3,955,163 A | * | 5/1976 | Novak | 355/132 |
| 4,054,383 A | * | 10/1977 | Lin et al. | 355/91 |
| 4,711,570 A | * | 12/1987 | Nelen | 355/91 |
| 5,160,959 A | | 11/1992 | Everett et al. | |
| 5,427,599 A | * | 6/1995 | Greschner et al. | 65/305 |
| 6,232,023 B1 | * | 5/2001 | Matsuki et al. | 430/22 |
| 6,294,450 B1 | | 9/2001 | Chen et al. | |

(Continued)

FOREIGN PATENT DOCUMENTS

WO    WO 02/07199    1/2002

OTHER PUBLICATIONS

D. J. Resnick et al., "Imprint lithography for integrated circuit fabrication," J. Vac. Sci. Technol., B 21(6), Nov./Dec. 2003, pp. 2624-2631.

(Continued)

*Primary Examiner*—Peter B Kim
*Assistant Examiner*—Christina Riddle

(57) ABSTRACT

A contact lithography apparatus and a method use one or both of spacers and a mesa to facilitate pattern transfer. The apparatus and the method include one or both of a spacer that provides a spaced apart orientation of lithographic elements, such as a patterning tool and a substrate, when in mutual contact with the spacer and a mesa between the patterning tool and the substrate. The mesa supports a contact surface of one or both of the mold and the substrate. One or both of the spacers and the mesa may be non-uniform. One or more of the patterning tool, the substrate and the spacer is deformable, such that deformation thereof facilitates the pattern transfer.

20 Claims, 6 Drawing Sheets

U.S. PATENT DOCUMENTS

| | | | |
|---|---|---|---|
| 6,459,474 B1 * | 10/2002 | Okada | 355/78 |
| 6,482,742 B1 | 11/2002 | Chou | |
| 6,713,238 B1 | 3/2004 | Chou et al. | |
| 6,719,915 B2 | 4/2004 | Wilson et al. | |
| 6,784,979 B2 * | 8/2004 | Tajima et al. | 355/78 |
| 6,814,898 B1 | 11/2004 | Deeman et al. | |
| 6,994,541 B2 | 2/2006 | Chung et al. | |
| 7,190,438 B2 * | 3/2007 | Yamaguchi et al. | 355/78 |
| 7,331,283 B2 * | 2/2008 | Sewelll | 101/3.1 |
| 2003/0103195 A1 * | 6/2003 | Tsuruma et al. | 355/53 |
| 2005/0057752 A1 * | 3/2005 | Inao et al. | 356/400 |
| 2010/0021577 A1 * | 1/2010 | Stewart et al. | 425/3 |

OTHER PUBLICATIONS

Xing Cheng et al., "One-step lithography for various size patterns with a hybrid mask-mold," Microelectronic Engineering, 71, 2004, pp. 288-293.

* cited by examiner

CONTACT LITHOGRAPHY APPARATUS AND METHOD

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-3-0005 awarded by the Defense Advanced Research Projects Agency.

CROSS-REFERENCE TO RELATED APPLICATIONS

N/A

BACKGROUND

1. Technical Field

The invention relates to semiconductors and the fabrication thereof. In particular, the invention relates to contact and/or imprint lithography used to define one or both of micro-scale and nano-scale structures during semiconductor fabrication.

2. Description of Related Art

Photographic contact lithography and imprint lithography are examples of two lithography methodologies for defining micro-scale and nano-scale structures that generally involve direct contact between a patterning tool (e.g., mask, mold, template, etc.) and a substrate on which the structures are to be fabricated. In particular, during photographic contact lithography, the patterning tool (i.e., mask) is aligned with and then brought in contact with the substrate or a pattern receiving layer of the substrate. The pattern is then transferred to the pattern receiving layer using a photographic technique such as illuminating the patterning tool and pattern receiving layer with a radiation source (e.g., ultraviolet light, an electron beam, X-ray radiation, etc.) Similarly, in imprint lithography, the patterning tool (i.e., mold) is aligned with the substrate after which the pattern is printed on or impressed into a receiving surface of the substrate through a direct contact between the mold and receiving surface.

In both of contact lithography and imprint lithography, alignment between the patterning tool and the substrate generally involves holding the patterning tool a small distance above the substrate while lateral and rotational adjustments (e.g., x-y translation and/or angular rotation) are made to a relative position of the tool and/or substrate. Ultimate alignment accuracy as well as an achievable patterning resolution may be affected by a degree to which the patterning tool and substrate are both mutually parallel and proximal during the alignment process. In addition, alignment accuracy may be affected by a drift or slip in the relative positioning of the aligned patterning tool and substrate that may occur as the tool is brought into contact with the substrate following alignment. Furthermore, a relative contact pressure between and an overall extent of the contact between the patterning tool and receiving surface of the substrate may affect an achievable patterning resolution and accuracy.

BRIEF SUMMARY

In some embodiments of the present invention, a contact lithography apparatus is provided. A contact lithography apparatus comprises a patterning tool having a patterned area with a lithographic pattern. The contact lithography apparatus further comprises a plurality of non-uniform spacers disposed between the patterning tool and a substrate being patterned, the plurality of non-uniform spacers providing a spaced apart and proximal orientation of the patterning tool and the substrate when the patterning tool and the substrate are in mutual contact with the non-uniform spacers. One or more of the patterning tool, the substrate and the spacer is deformable, such that a deformation facilitates pattern transfer.

In other embodiments of the present invention, a contact lithography apparatus is provided. The contact lithography apparatus comprises a patterning tool having a patterned area with a lithographic pattern. The contact lithography apparatus further comprises a substrate having a target portion that receives the lithographic pattern. The contact lithography apparatus further comprises a mesa on one or both of the patterning tool and the substrate, the mesa supporting a respective one or both of the pattered area and the target portion. The contact lithography apparatus further comprises a spacer disposed between and providing a spaced apart orientation of the patterning tool and the substrate when the patterning tool and the substrate are in mutual contact with the spacer. One or both of the patterning tool and the substrate is deformable to facilitate transfer of the lithographic pattern.

In other embodiments of the present invention, a method of contact lithography is provided. The method of contact lithography comprises orienting a lithographic patterning tool and a substrate being patterned in a spaced apart relationship using a spacer in mutual contact with the patterning tool and the substrate. The method of contact lithography further comprises inducing a deformation of one or more of the patterning tool, the substrate and the spacer, such that the patterning tool and the substrate are brought into direct contact to transfer a pattern. The method of contact lithography further comprises adapting the induced deformation using one or both of non-uniform spacers and a non-uniform mesa between the patterning tool and the substrate. Inducing a deformation comprises one or more of flexing the patterning tool, flexing the substrate and deforming the spacer to close a space between the mold and the substrate that is created by the spacer.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
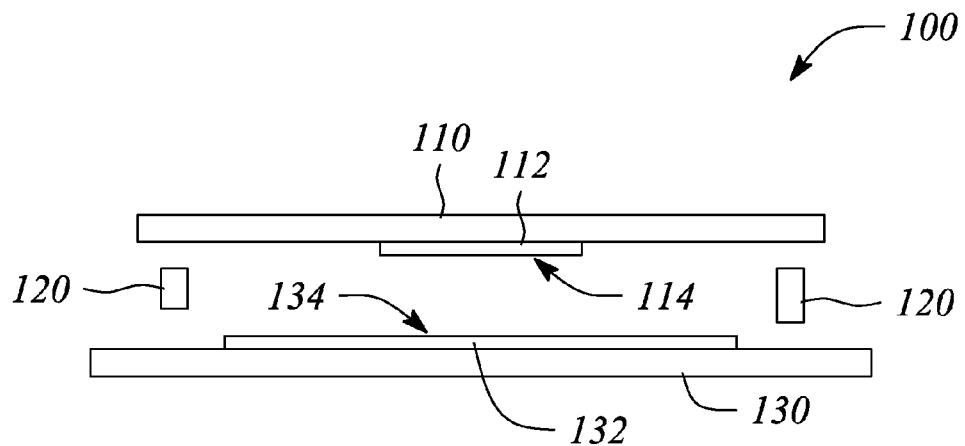
FIG. 1 illustrates a side view of a contact lithography apparatus according to an embodiment of the present invention.

Embodiments of the present invention facilitate patterning a substrate using lithography involving a contact between a patterning tool and a substrate. In various embodiments, the present invention employs one or more spacers between the patterning tool and the substrate to establish a spaced apart and proximal orientation therebetween. The spaced apart and proximal orientation provided by the spacers is readily maintained during one or both of lateral and rotational adjustments between the patterning tool and the substrate to establish a target alignment of the tool and the substrate. In addition, according to various embodiments of the present invention, a flexure or deformation of one or more of the patterning tool, the substrate, and the spacer facilitates the contact between the substrate and the patterning tool. The flexure-facilitated contact has little or no adverse effect on the previously established lateral and rotational alignment according to various embodiments of the present invention. Contact lithography employing flexure-facilitated contact is described by Stewart et al. in co-pending U.S. patent application Ser. No. 11/203,551, incorporated herein by reference in its entirety (hereinafter 'Stewart et al.'). The embodiments of the present invention comprise one or both of non-uniform spacers and a mesa to further enhance or augment flexure-facilitated contact during contact lithography. In some embodiments the mesa is a non-uniform mesa.

Herein, 'non-uniform spacers' means a plurality of spacers used for flexure-facilitated contact in contact lithography wherein the spacers provide a non-uniform spacing distance or dimension between the patterning tool and the substrate in contact lithography. In particular, one or more spacers of the plurality provide a spacing distance or dimension that differs from at least one other spacer of the plurality. As such, the spacers are collectively referred to as 'non-uniform spacers'. In some embodiments, the non-uniform spacing distance is established at an initial mutual contact between the patterning tool, substrate and non-uniform spacers. In other embodiments, the non-uniform spacing distance is provided after application of a deforming force associated with flexure-facilitated contact.

Specifically, the non-uniform or differing spacing distance provided by the non-uniform spacers may facilitate a pre-bending or a pre-deforming during contact lithography, in some embodiments. In such embodiments, an initial spacing may be essentially uniform when an initial mutual contact is achieved between at least one of the non-uniform spacers, the patterning tool, and the substrate. The pre-bending occurs upon application of the deforming force after which mutual contact with others of the non-uniform spacers further influences the deformation resulting in a non-uniform spacing dimension being established. In some embodiments, an effective improvement in a localized parallelism of contacting surfaces during contact lithography may result from the pre-bending.

In some embodiments, the differing spacing distance produces an essentially non-uniform spacing between the patterning tool and the substrate at the initial mutual contact. The spacing may continue to be non-uniform during part or all of an application of the deforming force. Such a non-uniform spacing between the patterning tool and substrate may facilitate establishing a non-uniform contact pressure between respective contacting surfaces of the patterning tool and the substrate, according to some embodiments.

In some embodiments, the non-uniform spacing provided by non-uniform spacers facilitates evacuation of a gas from between the patterning tool and the substrate during contact lithography. In some embodiments, the non-uniform spacing provided by non-uniform spacers facilitate migration of a material of a pattern receiving layer (e.g., liquid resist) across an extent of an interface between the patterning tool and the substrate during contact lithography. Facilitating gas evacuation or receiving layer material migration may improve an effective contact between the contacting surfaces and thus, improve fidelity of the contact lithography and an ultimate achieved resolution of the transferred pattern as a result, according to some embodiments.

In some embodiments, the non-uniform spacing distance may essentially accommodate a 'natural' or existing bend, deformation in, or non-planarity of a contacting surface of one or both of the patterning tool and the substrate. In some embodiments, an effective improvement in a localized parallelism of contacting surfaces during contact lithography may result from such an accommodation.

Herein, a 'mesa' in, on or associated with a surface is defined as a raised portion of the surface that extends above or beyond a mean plane of the surface. Thus, when a surface of the patterning tool is arranged adjacent and opposed to a surface of the substrate during contact lithography, a mesa is a portion of one of the patterning tool surface and the substrate surface that is generally closer to the respective opposing surface than the mean plane of the surface having the mesa. The mean plane of the surface is also referred to herein as a 'mean surface plane'. In some embodiments, the mean surface plane is a plane containing the surface (e.g., substrate or patterning tool surface) but excluding a surface of the mesa. A 'non-uniform mesa' means a mesa having a non-uniform profile or cross-sectional extent above the mean plane of the surface. According to some embodiments, the non-uniform mesa provides a non-uniform spacing distance that is analogous to and serves similar to the non-uniform spacing distance provided by the non-uniform spacers. Moreover, an effect of the non-uniform spacing distance provided by the non-uniform mesa may be essentially similar to that provided by the non-uniform spacers.

In some embodiments, a pattern of the patterning tool is located in part or in whole on a surface of the mesa. In such embodiments, the pattern is said to be located 'on the mesa'. Furthermore, the mesa upon which the pattern is located may be a non-uniform mesa, according to some embodiments. In such mesa embodiments, a raised portion of the mesa may represent a portion of the patterning tool that is essentially thicker than a remaining portion of the patterning tool lying outside of or beyond a region encompassed by the mesa, for example.

According to other embodiments, a receiving portion of a contacting surface of a substrate may comprise a mesa. The 'receiving portion' is a portion of the substrate that receives a pattern from the patterning tool during contact lithography. In such embodiments, the receiving portion is said to be 'on the mesa'. In yet other embodiments, both the patterning tool and substrate may comprise a mesa in respective portions of the contacting surfaces thereof.

Herein, the term 'deformation' generally includes within its scope one or both of a plastic deformation and an elastic deformation.

Herein, the term 'deformation' further generally includes within its scope one or both of a passive deformation and an active deformation. Herein, the term 'flexure' has the same meaning as 'deformation' and the terms are used interchangeably as are 'flex' and 'deform'; 'flexible' and 'deformable'; and 'flexing' and 'deforming', or the like.

Further herein, the term 'contact lithography' generally refers to essentially any lithographic methodology that employs a direct or physical contact between means for providing a pattern at the patterning tool and means for receiving the pattern or the substrate, including a substrate having a pattern receiving layer, without limitation. Specifically, 'contact lithography' as used herein includes, but is not limited to, various forms of photographic contact lithography, X-ray contact lithography, and imprint lithography. Imprint lithography includes, but is not limited to, micro-imprint lithography and nano-imprint or nano-scale imprint lithography (NIL).

For example, in photographic contact lithography, a physical contact is established between a photomask (i.e., the patterning tool) and a photosensitive resist layer on the substrate (i.e., the pattern receiving means). During the physical contact, visible light, ultraviolet (UV) light, or another form of radiation passing through the photomask exposes the photoresist. As a result, a pattern of the photomask is transferred to the substrate. In imprint lithography, a mold (i.e., the patterning tool) transfers a pattern to the substrate through an imprinting process, for example. In some embodiments, a physical contact between the mold and a layer of formable or imprintable material on the substrate (i.e., the pattern receiving means or pattern receiving layer material), transfers the pattern to the substrate.

For simplicity herein, no distinction is made between the substrate and any layer or structure on the substrate (e.g., photoresist layer or imprintable material layer) unless such a distinction is necessary for proper understanding. As such, the pattern receiving means is generally referred to herein as a 'substrate' irrespective of whether a resist layer or other formable material layer may be employed on the substrate to receive the pattern. Moreover, the patterning tool (e.g., photomask, X-ray mask, imprint mold, template, etc.) is also referred to herein as either a 'mold' or a 'mask' for simplicity of discussion and not by way of limitation. Examples described herein are provided for illustrative purposes only and not by way of limitation.

FIG. 1 illustrates a side view of a contact lithography apparatus 100 according to an embodiment of the present invention. The contact lithography apparatus 100 comprises a patterning tool or 'mold' 110 and a plurality of non-uniform spacers 120. The contact lithography apparatus 100 copies, prints, imprints or otherwise transfers a pattern from the mold 110 to a substrate 130. In particular, a direct contact between the mold 110 and the substrate 130 is employed during a pattern transfer associated with the contact lithography performed by apparatus 100.

In the contact lithography apparatus 100, the non-uniform spacers 120 are located between the mold 110 and the substrate 130 prior to and during pattern transfer. The non-uniform spacers 120 initially provide for and maintain an essentially defined separation between the mold 110 and the substrate 130. Specifically, the non-uniform spacers 120 disposed between the mold 110 and substrate 130 provide a spaced apart and proximal orientation of the mold 110 and substrate 130 when the mold 110 and the substrate 130 are in mutual contact with the non-uniform spacers 120.

During contact lithography, a deformation of one or more of the mold 110, the non-uniform spacers 120, and the substrate 130 facilitates the pattern transfer by enabling the mold 110 and the substrate 130 to contact one another. The pattern being transferred is 'carried' by a patterned area, region, or portion 112 of the mold 110. The pattern being transferred is received by a receiving or target area, region, or portion 132 of the substrate 130. While contacting one another, a contacting surface 114 of the mold 110 is in direct contact with a contacting surface 134 of the substrate 130 to facilitate pattern transfer.

For example, in some embodiments, one or both a flexible mold 110 and a flexible substrate 130 is employed. In another embodiment, deformable (e.g., collapsible) non-uniform spacers 120 are employed. In yet other embodiments, a combination of one or more of a flexible mold 110, a flexible substrate 130 and deformable, non-uniform spacers 120 are employed. In embodiments that include the combination, rigidity may be provided by a plate or carrier that supports one or both of the mold 110 and the substrate 130 during pattern transfer, as described below. Pattern transfer occurs while the mold 110 and the substrate 130 are in direct contact at the contacting surfaces 114, 134, as a result of the flexure and/or deformation.

In some embodiments, especially where flexure of one or both of the mold 110 and the substrate 130 are employed, the flexure may occur between or within a region encompassed or bounded by the non-uniform spacers 120. For example, the non-uniform spacers 120 may be located at a periphery of one or both of the patterned region 112 of the mold 110 and the target area 132 of the substrate 130 and the flexure of one or both of the mold 110 and the substrate 130 occurs within the periphery.

In some embodiments, deformable, non-uniform spacers 120 are employed, and one or both of an essentially non-deformable mold 110 and an essentially non-deformable substrate 130 may be used. For example, a semi-rigid or rigid mold 110 that is not deformed, or not intended to be deformed, during pattern transfer may be the non-deformable mold 110. Furthermore, in some embodiments that use the deformable, non-uniform spacer 120, one or more of the non-uniform spacers 120 may be located within a broader patterned area or region of one or both of the mold 110 and the substrate 130. For example, the substrate 130 may be a wafer having a plurality of individual dice or chips defined thereon (not illustrated). The dice have respective individual local patterned areas. In this example, the deformable, non-uniform spacers 120 may be located in spaces or regions between the local patterned areas of the wafer substrate 130. Spaces or regions between local patterned areas include, but are not limited to, 'streets' or 'saw kerfs' separating the individual dice on the wafer substrate 130.

In some embodiments, the non-uniform spacers 120 are components separate from either the mold 110 or the substrate 130. In such embodiments, the non-uniform spacers 120 are generally positioned, placed, or otherwise inserted between the mold 110 and the substrate 130 prior to establishing contact between the mold 110 and substrate 130 for the pattern transfer.

In other embodiments, the non-uniform spacers 120 are formed as an integral part of one or both of the mold 110 and the substrate 130. For example, the non-uniform spacers 120 may be fabricated as an integral part of the mold 110 in some embodiments. In other embodiments, the non-uniform spacers 120 may be fabricated as an integral part of the substrate 130. In yet other embodiments, some of the non-uniform spacers 120 may be formed as an integral part of one or both of the mold 110 and the substrate 130 while others of the non-uniform spacers 120 are not integral to either the mold 110 or the substrate 130. In some embodiments, some of the spacers 120 are non-uniform while others are uniform spacers 120 including, but not limited to, a plurality of sets of spacers, where a set comprises uniform spacers but one set is non-uniform relative to another set in the plurality.

In some embodiments, the non-uniform spacers 120 that are integral to one or both of the mold 110 and the substrate 130 are formed by depositing or growing a material layer on a respective surface of either the mold 110 or the substrate 130. For example, a silicon dioxide ($SiO_2$) layer may be either grown or deposited on a surface of a silicon (Si) substrate 130. Selective etching of the deposited or grown $SiO_2$ layer may be employed to define the non-uniform spacers 120, for example, resembling stand-off posts. In some embodiments, a non-uniform height of each of the stand-off post spacers 120 is established by virtue of a differential growth or deposition of the spacers 120. As used herein, 'differential' growth or deposition means that one or more spacers is grown or deposited at a rate that differs from another spacer 120 of the non-uniform spacers 120 resulting in spacers 120 of effectively different heights. For example, forming the non-uniform spacers 120 using an evaporative material deposition on the substrate 130 surface wherein the deposition rates differ from one spacer 120 to another will generally result in each of the non-uniform spacers 120 having essentially different heights. Alternatively or in addition, post-processing of the grown and/or deposited non-uniform spacers 120 such as, but not limited to, micro-machining (e.g., chemical-mechanical polishing, etc.) may be employed to further adjust and/or to provide for non-uniform height. Similar methods may be employed to form the non-uniform spacers 120 on or as an integral part of the mold 110.

Whether separately provided or fabricated (i.e., formed) as part of one or both of the mold 110 and the substrate 130, in some embodiments, the non-uniform spacer 120 comprises a controlled dimension. Specifically, the non-uniform spacers 120 may be fabricated with a precisely controlled dimension for spacing apart or separating the mold 110 and the substrate 130, the precisely controlled dimension being individually determined for each spacer 120. As used herein, the term 'spacing dimension' refers to a dimension of the non-uniform spacers 120 that controls the separation between the mold 110 and the substrate 130 when the non-uniform spacers 120 are employed in the contact lithography apparatus 100. For convenience of discussion and not by way of limitation, the spacing dimension of the non-uniform spacers 120 is sometimes referred to herein as or being associated with a 'height' of the spacer 120.

In yet other embodiments, the non-uniform spacers 120 may be separately fabricated and then affixed to one or both of the mold 110 and the substrate 130 using glue, epoxy or other suitable means for joining. However, whether fabricated as an integral part of, or affixed to, one or both of the mold 110 or the substrate 130, the non-uniform spacers 120 are so fabricated or affixed prior to performing contact lithography that employs the contact lithography apparatus 100.

As mentioned above, a height of each of the non-uniform spacers 120 may be precisely and individually controlled during fabrication. As a result, when the non-uniform spacers 120 act together to separate the mold 110 from the substrate 130, the separation takes on a precisely controlled initial (i.e., pre-deformation) spacing dimensions equal to the heights of the various non-uniform spacers 120.

In some embodiments, the non-uniform spacers 120 provide a pre-deformation spacing dimension (i.e., proximal relationship) in the range of about 0.01 microns (μm) to about 50 microns (μm). In other embodiments, the non-uniform spacers 120 provide a spacing dimension in a range of about 0.1 microns (μm) to about 10 microns (μm). In yet other embodiments, the non-uniform spacers 120 may provide essentially any spacing dimension that befits a particular contact lithography situation or application and still be within the scope of the various embodiments of the present invention.

As discussed above, one or more of the mold 110, the non-uniform spacers 120 and the substrate 130 are 'deformable components' to provide for contact of the contacting surfaces 114, 134 during use of the contact lithography apparatus 100. In some embodiments, the deformable components of the contact lithography apparatus 100 may provide one or both of passive deformation and active deformation. Passively deformable components may exhibit one or both of plastic and elastic deformation. A discussion of passive deformation and active deformation as well as examples of materials that may be used to achieve passive/active deformation is provided in Stewart et al., cited supra.

Figure 2A:
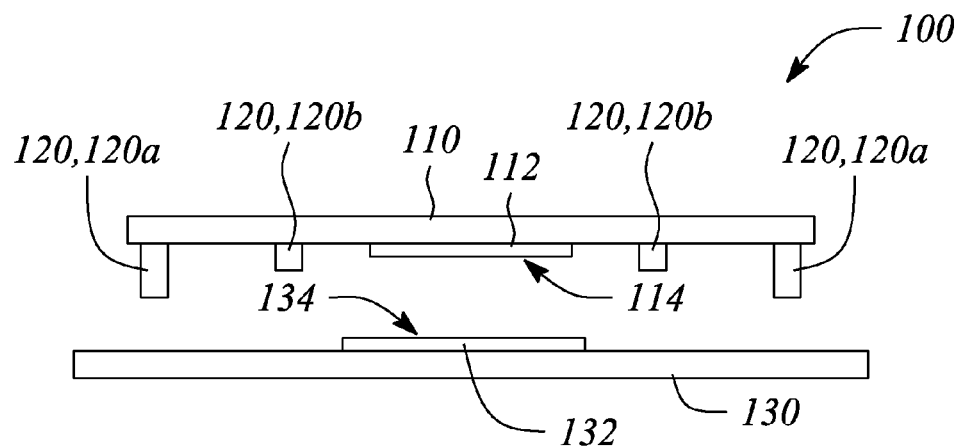
FIG. 2A illustrates a side view of an embodiment of the contact lithography apparatus illustrated in FIG. 1 according to the present invention.

FIG. 2A illustrates a side view of an embodiment of the contact lithography apparatus 100 illustrated in FIG. 1 according to the present invention. For purposes of illustration, the non-uniform spacers 120 are depicted as attached to and thus associated with the mold 110. Further illustrated in FIG. 2A, a first set 120a of the non-uniform spacers 120 is taller and thus provides a greater spacing distance than a second set 120b of non-uniform spacers 120. The second set 120b is located closer to a pattern region or area 112 of the mold 110 when compared to the first set 120a. As described further below, such an arrangement of the non-uniform spacers 120 may facilitate pre-bending during deformation that leads to a preferential flattening of the pattern region during flexure-facilitated contact lithography, according some embodiments.

In another embodiment (not illustrated), the first and second sets 120*a*, 120*b* of the non-uniform spacers 120 may be associated with (e.g., attached to or integral with) the substrate 130 instead of the mold 110, as illustrated in FIG. 2A. In yet other embodiments (not illustrated), some of the non-uniform spacers 120 of the first set 120*a* and of the second set 120*b* may be associated with the mold 110 while the balance of the non-uniform spacers 120 from the sets 120*a*, 120*b* are associated with the substrate 130. In yet other embodiments (not illustrated), one set of the non-uniform spacers 120 (e.g., the first set 120*a*) is associated with the mold 110 while the other set of the non-uniform spacers 120 (e.g., the second set 120*b*) is associated with the substrate 130. In other embodiments (not illustrated), one or both of the first set 120*a* and the second set 120*b* are separately provided and thus not directly associated with either the mold 110 or the substrate 130. Other arrangements of the non-uniform spacers 120 beyond those described herein may be readily devised. All such arrangements are within the scope of the present invention.

Figure 2B:
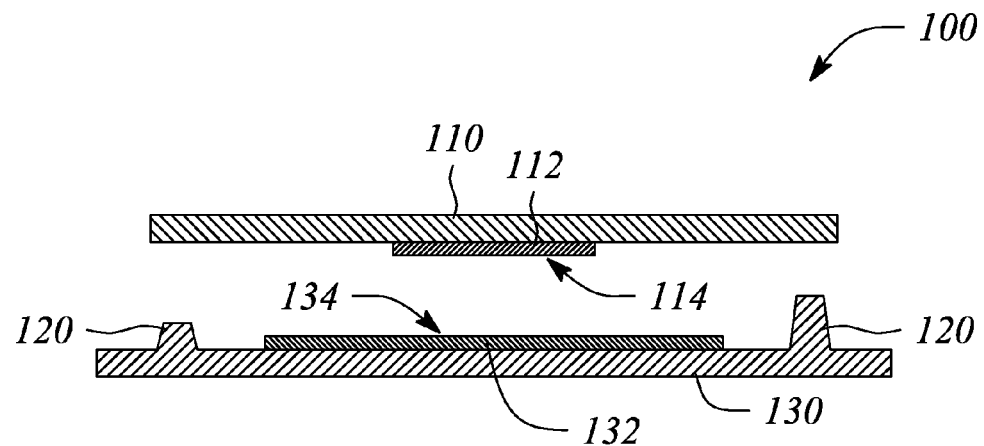
FIG. 2B illustrates a cross sectional view of another embodiment of the contact lithography apparatus illustrated in FIG. 1 according to the present invention.

FIG. 2B illustrates a cross sectional view of another embodiment of the contact lithography apparatus 100 illustrated FIG. 1 according to the present invention. As illustrated in FIG. 2B, the non-uniform spacers 120 are formed as an integral part of the substrate 130. Further, as illustrated in FIG. 2B, the non-uniform spacer 120 on a left end of the substrate 130 is shorter in height (i.e., provides a smaller spacing dimension) than the non-uniform spacer 120 on a right end, for example. Such an exemplary arrangement of non-uniform spacers 120 provides for an initial contact between respective contact surfaces 114, 134 of the mold 110 and the substrate 130 to occur closer to the left end of the substrate 130. Since initial contact is closer to the left end, during flexure-facilitated contact lithography, a proportionally higher contact pressure will be exerted in a vicinity of a point of the initial contact. Furthermore, contact will progress from left to right such that evacuation of gas from between the contact surfaces 114, 134 is facilitated in some embodiments. Additional discussion of such an arrangement of non-uniform spacers 120 is provided below.

Figure 2C:
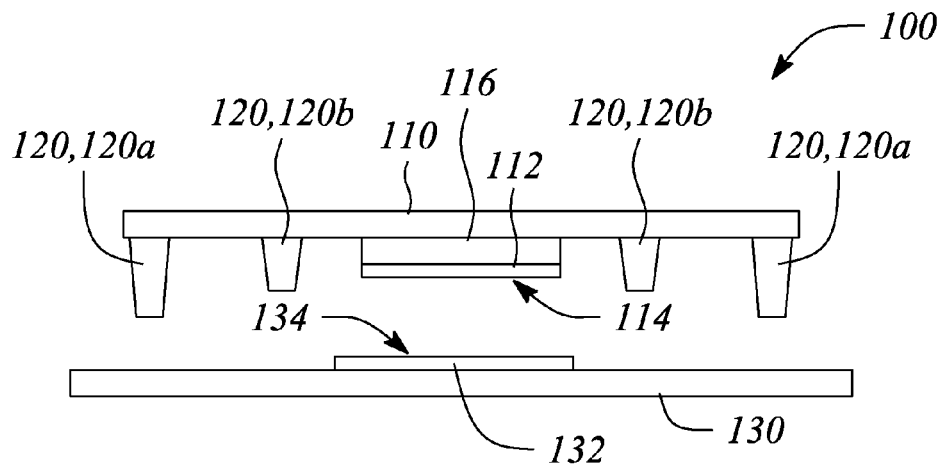
FIG. 2C illustrates a side view of another embodiment of the contact lithography apparatus illustrated in FIG. 1 according to the present invention.

FIG. 2C illustrates a side view of another embodiment of the contact lithography apparatus 100 illustrated in FIG. 1 according to the present invention. In this embodiment, the mold 110 of the contact apparatus 100 further comprises a mesa 116, wherein the patterned area 112 and associated contacting surface 114 of the mold 110 is located on the mesa 116. The mesa 116 establishes a defined boundary between the contacting surface 114 and a remaining surface of the mold 110. In some embodiments, the mesa 116 facilitates localizing a contact pressure between the contact surface 114 of the mold 110 and the contact surface 134 of the substrate 130 to within the defined boundary.

In some embodiments, the mesa 116 may further facilitate controlling a deformation of the mold 110 during flexure-facilitated contact lithography. For example, deformation of the mold 110 may occur in a deformation region peripheral to or between the mesa 116 and the non-uniform spacers 120 in preference to other regions, in some embodiments. As a result, any distortion of the patterned area 112 of the mold 110 may be reduced by the mesa 116 during flexure-facilitated contact lithography.

For example, a thickness of the mold 110 is greater within a boundary of the mesa 116 as compared to the deformation region outside the boundary. The greater thickness essentially limits deformation of the mold 110 in a vicinity of the mesa 116 when a deforming force is applied. As such, deformation preferentially occurs and is largely confined to the deformation region due to the presence of the mesa 116. Thus, the patterned area 112 may remain more planar and thus less distorted during contact lithography when located on the mesa 116. In other embodiments (not illustrated), the substrate 130 may comprise a mesa and a deforming region that is peripheral to the mesa that is either in lieu of or in addition to the mesa 116 and the deformation region of the mold 110.

Figure 3A:
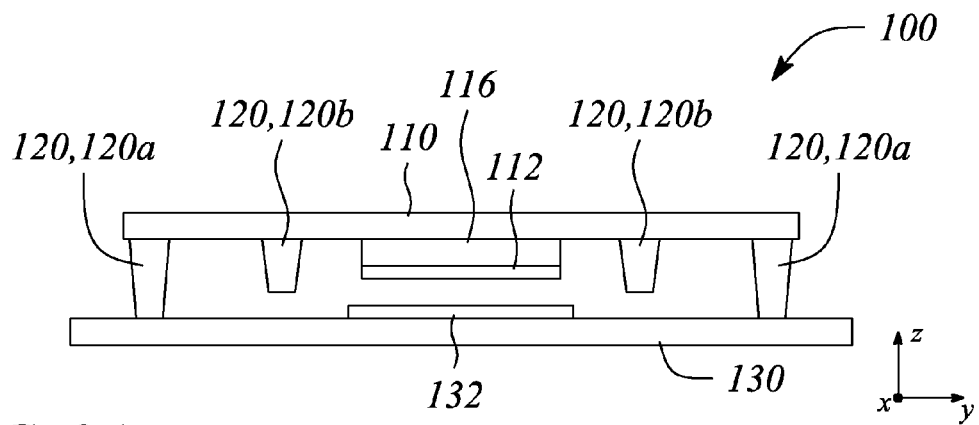
FIG. 3A illustrates a side view of a contact lithography apparatus according to an embodiment of the present invention.
Figure 3B:
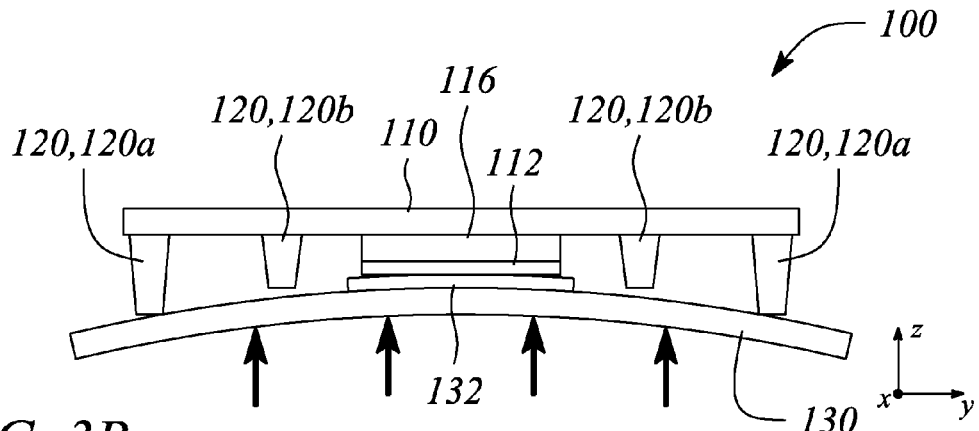
FIG. 3B illustrates a side view of the contact lithography apparatus illustrated in FIG. 3A following a partial application of a deforming force according to an embodiment of the present invention.
Figure 3C:
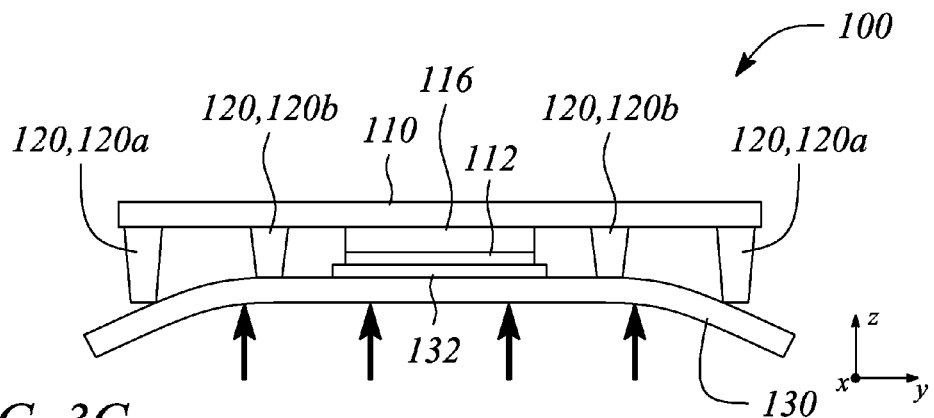
FIG. 3C illustrates a side view of the contact lithography apparatus illustrated in FIG. 3B following an application of additional pressure of the deforming force according to an embodiment of the present invention.

FIGS. 3A-3C collectively illustrate a cooperative action of the non-uniform spacers 120 during flexure-facilitated contact lithography according to an embodiment of the present invention. Furthermore, the non-uniform spacers 120 illustrated in FIGS. 3A-3C are arranged and configured as illustrated in FIG. 2A, for example and not by way of limitation. As illustrated in FIGS. 3A-3C, the mold 110 and the substrate 130 are each oriented in an x-y plane and spaced apart from one another along a z-axis direction of an exemplary Cartesian coordinate system. Moreover, in the example illustrated in FIGS. 3A-3C, the heights of the first set 120*a* of spacers 120 are all essentially equal to one another.

In particular, FIG. 3A illustrates a side view of a contact lithography apparatus 100 according to an embodiment of the present invention. The side view illustrated in FIG. 3A depicts the contact lithography apparatus 100 in an exemplary initial configuration prior to initiating pattern transfer through an application of a deforming force. In the illustrated initial configuration of FIG. 3A, the first set 120*a* of non-uniform spacers 120 separate the mold 110 and the substrate 130 and provide the spacing therebetween. As such, in the initial configuration, the mold 110 and the substrate 130 are not only spaced apart by the first set 120*a* of non-uniform spacers 120, but also are initially aligned or oriented essentially parallel to one another by the equal height of the first set 120*a* of the non-uniform spacers 120.

FIG. 3B illustrates a side view of the contact lithography apparatus 100 illustrated in FIG. 3A following a partial application of a deforming force according to an embodiment of the present invention. As illustrated in FIG. 3B, the partial application of the deforming force is depicted by large, vertically oriented arrows directed toward a bottom surface of the substrate 130. Partial application of the deforming force induces the substrate 130 to bend toward the mold 110. Essentially, the first set 120*a* of non-uniform spacers 120 resists the deforming force such that the substrate 130 pre-bends or pre-deforms, as illustrated.

FIG. 3C illustrates a side view of the contact lithography apparatus 100 illustrated in FIG. 3B following an application of additional pressure of the deforming force according to an embodiment of the present invention. As the additional pressure is applied, the substrate 130 eventually contacts the second set 120*b* of the non-uniform spacers. The second set 120*b* of non-uniform spacers 120 further resists the deforming force associated with the additional pressure. In some embodiments, the second set 120*b* acts cooperatively and in combination with the first set 120*a* to further deform or alternatively to resists further deformation of the substrate 130. The combined cooperative action of the first and second sets 120*a*, 120*b* of non-uniform spacers 120 essentially establishes a target z-axis alignment between or contour of the contacting surfaces of the mold 110 and substrate 130.

As illustrated in FIG. 3C, the target region 132 of the substrate 130 is flattened (i.e., target contour) by the cooperative interaction. The flattening of the target region 132 may improve a quality or fidelity of a transferred pattern by reducing pattern distortions associated with substrate deformation.

In some embodiments, a region between the target region 132 and the second set 120b of the non-uniform spacers 120 is also flattened by the cooperative interaction of the sets 120a, 120b of non-uniform spacers 120. In these embodiments, any distortions in an edge of the transferred pattern may be reduced as well. In other words, the second set 120b acts cooperatively and in combination with the first set 120a to 'resist further deformation' of the substrate 130 during the application of additional pressure. Through the further resistance, a target contour (e.g., flattened contacting surfaces) is achieved.

Figure 4A:
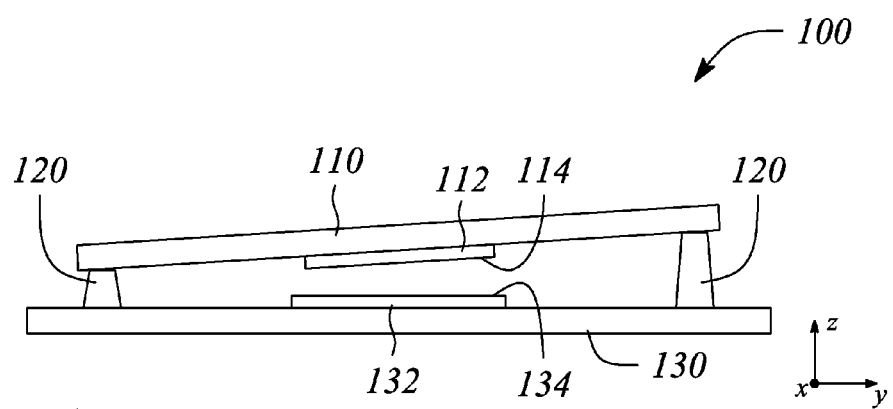
FIG. 4A illustrates a side view of a contact lithography apparatus according to an embodiment of the present invention.
Figure 4B:
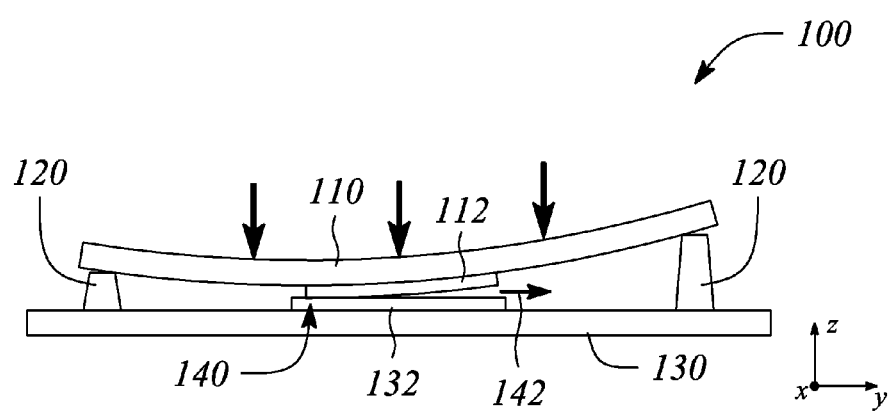
FIG. 4B illustrates a side view of the contact lithography apparatus illustrated in FIG. 4A following a partial application of a deforming force according to an embodiment of the present invention.
Figure 4C:
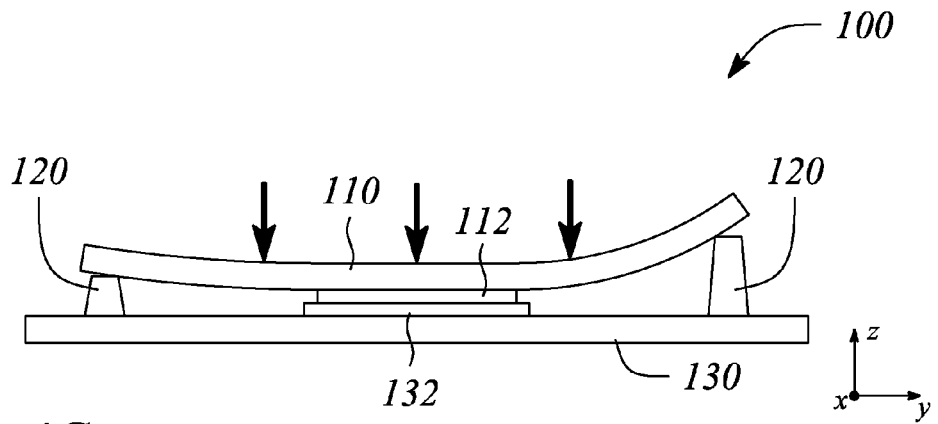
FIG. 4C illustrates a side view of the contact lithography apparatus illustrated in FIG. 4B following an application of additional pressure of the deforming force according to an embodiment of the present invention.

FIGS. 4A-4C illustrate a cooperative action of the non-uniform spacers 120 arranged as illustrated in FIG. 2B during flexure-facilitated contact lithography according to another embodiment of the present invention. As illustrated in FIGS. 4A-4C, a non-uniform spacer 120 on a left end is shorter than a non-uniform spacer 120 on a right end of the substrate 130, for example. Moreover, in the example illustrated in FIGS. 4A-4C, the heights of the non-uniform spacers 120 are essentially unequal to one another. As such, as illustrated in FIGS. 4A-4C, the mold 110 and the substrate 130 are each oriented in an x-y plane and spaced apart unevenly or non-uniformly from one another along a z-axis direction of an exemplary Cartesian coordinate system according to the unequal heights of the non-uniform spacers 120.

In particular, FIG. 4A illustrates a side view of a contact lithography apparatus 100 according to an embodiment of the present invention. The side view illustrated in FIG. 4A depicts the contact lithography apparatus 100 in an exemplary initial configuration prior to initiating pattern transfer through an application of a deforming force. The 'initial configuration' comprises a condition in which an initial mutual contact between the mold 110, non-uniform spacers 120 and substrate 130 is achieved but the deforming force has not yet been applied to any appreciable extent. In the illustrated initial configuration, the non-uniform spacers 120 are in contact with and separate the mold 110 and the substrate 130 (i.e., mutual contact). As such, the mold 110 and the substrate 130 are not only spaced apart by the non-uniform spacers 120 but also are initially aligned essentially non-parallel to one another by the unequal heights of the non-uniform spacers 120 of this embodiment.

FIG. 4B illustrates a side view of the contact lithography apparatus 100 illustrated in FIG. 4A following a partial application of a deforming force according to an embodiment of the present invention. As illustrated, the application of the deforming force is depicted by large, vertically oriented arrows directed toward a top surface of the mold 110. Application of the deforming force induces the mold 110 to bend toward the substrate 130.

Given the unequal heights of the non-uniform spacers 120 and non-parallel alignment imparted thereby, the partial application of the deforming force causes the patterned area 112 of the mold 110 to initially contact the target area 132 of the substrate 130 in a region adjacent to where the non-uniform spacers 120 are shorter in preference to a region adjacent to where others of the non-uniform spacers 120 are taller. In FIG. 4B, the patterned area 112 initially and preferentially contacts the target area 132 at an initial contact point 140, which is nearer to a left end of the target area 132 (i.e., near to the shorter non-uniform spacer 120), for example. The non-uniform spacers 120 resist the deforming force such that the mold 110 bends unequally, as illustrated in FIG. 4B.

FIG. 4C illustrates a side view of the contact lithography apparatus 100 illustrated in FIG. 4B following an application of additional pressure of the deforming force according to an embodiment of the present invention. As the additional pressure is applied, the patterned area 112 of the mold 110 eventually contacts a remaining portion of the target area 132. Essentially, contact occurs initially at the initial contact point 140 and then spreads across the contacting surfaces 114, 134 generally away from the initial contact point 140 with the application of additional pressure.

In some embodiments, a higher pressure is established between the patterned area 112 and the target area 132 in a vicinity of the initial contact point 140 during the application of additional pressure relative to the remaining portion of the target area 132. In such embodiments, the established higher pressure in localized regions around the initial contact point 140 may facilitate pattern transfer. For example, a pattern may include regions of one or both of higher density patterned areas and deeper pattern features in some embodiments. In these embodiments, pattern transfer may be enhanced by the localized higher pressure in the regions of the contacting surfaces that include one or both of the higher density patterns and deeper pattern features.

In some embodiments, as the contact increases between the target area 132 and the patterned area 112 away from the initial contact point 140, evacuation of gas (e.g., air) from between the contacting surfaces 114, 134 is facilitated. As such, it is less likely that gas may be trapped between the contacting surfaces 114, 134 than when initial contact occurs nearly simultaneously across the contacting surfaces 114, 134. Trapped gas may interfere with pattern transfer, for example. In addition, as the contact increases and spreads away from the initial contact point 140, a migration or a flow of a material of a pattern receiving layer on the contacting surface 134 (e.g., resist layer) may be facilitated. An arrow 142 illustrated in FIG. 4B depicts gas evacuation and material flow during contact lithography according to various embodiments of the present invention. A similar gas-evacuation/material-flow effect (not illustrated) may occur with the embodiments illustrated in FIGS. 3A-3C if an initial contact point is established during contact lithography.

In some embodiments, the contact lithography apparatus 100 is used in a contact lithography system (not illustrated). In such embodiments, the contact lithography system may comprise a contact mask aligner that holds and supports the contact lithography apparatus 100 during the deformation-facilitated pattern transfer. In some embodiments, the contact mask aligner provides an alignment between patterning tool and substrate of the apparatus 100.

Figure 5:
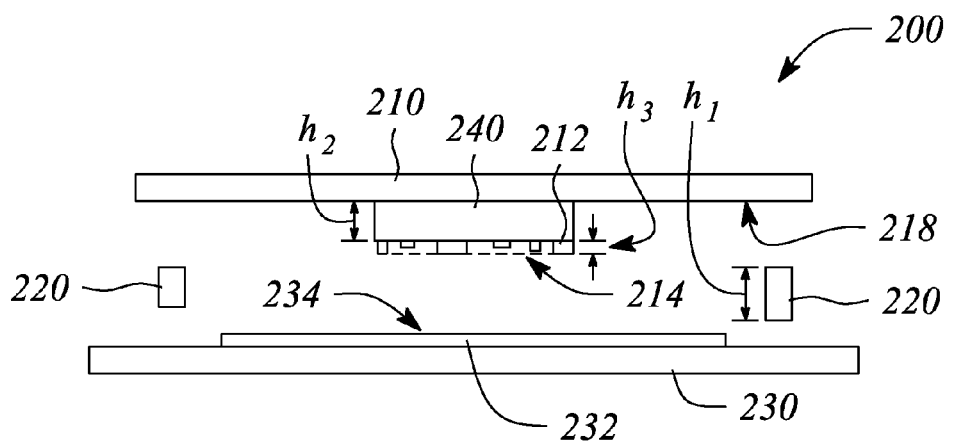
FIG. 5 illustrates a side view of a contact lithography apparatus according to another embodiment of the present invention.

FIG. 5 illustrates a side view of a contact lithography apparatus 200 according to another embodiment of the present invention. The contact lithography apparatus 200 comprises a patterning tool or 'mold' 210 and a plurality of spacers 220. The contact lithography apparatus 200 further comprises a mesa 240. The contact lithography apparatus 200 copies, prints, or otherwise transfers a pattern from the mold 210 to a substrate 230. In some embodiments, the contact lithography apparatus 200 is used in a contact lithography system (not illustrated) comprising a mask aligner.

During contact lithography, the pattern is carried by a patterned area 212 of the mold 210. The pattern is received by a target portion, region or area 232 of the substrate 230. In particular, a direct contact between the mold 210 or a contacting surface 214 thereof and the substrate 230 or a contacting surface 234 thereof is employed during a pattern transfer associated with the contact lithography performed by apparatus 200. One or more of the mold 210, the spacers 220, and the substrate 230 undergo flexure or deformation during pattern transfer. As such, the contact lithography apparatus 200 provides flexure-facilitated contact lithography similar to that provided by the contact lithography apparatus 100 described above. The target area 232 is also referred to as a receiving portion, area or surface 232 herein. In some embodiments, the mold 210 is otherwise essentially similar to the mold 110 described above with respect to the contact lithography apparatus 100.

The mold 210 further comprises the mesa 240. The mesa 240 supports and lies between a patterned area 212 of the mold 210 and a major or mean surface 218 (i.e., mean surface plane) of the mold 210. As such, when aligned opposite the substrate 230 in the contact lithography apparatus 200, as illustrated in FIG. 5 for example, the mesa 240 positions the patterned area 212 and the associated contacting surface 214 of the mold 210 closer to the substrate 230 and its contacting surface 234 than that provided by the mean surface 218 of the mold 210. In these embodiments, the substrate 230 is essentially similar to the substrate 100 described above with respect to the contact lithography apparatus 100.

In some embodiments (not illustrated), the substrate 230 alternatively comprises the mesa 240 instead of the mold 210. In such embodiments, the mesa 240 supports and is situated between a target area 232 of the substrate 230 and a major or mean surface of the substrate 230. Further, in such embodiments, the substrate 230 and mold 210 are otherwise essentially similar to the substrate 130 and the mold 110, respectively, described above for the contact lithography apparatus 100.

Figure 6:
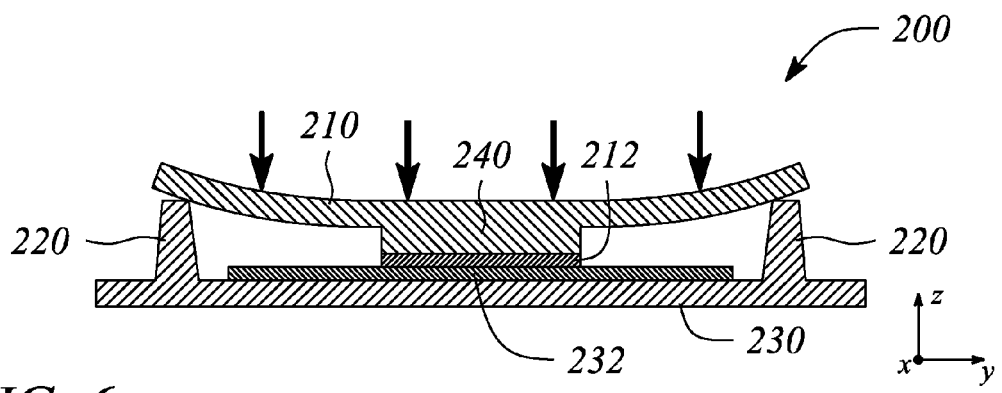
FIG. 6 illustrates a cross sectional view of a contact lithography apparatus comprising a mesa during flexure-facilitated contact lithography according to another embodiment of the present invention.

In some embodiments, the spacers 220 are uniform spacers providing an essentially uniform separation and parallel alignment between the mold 210 and the substrate 230. In such embodiments, the spacers 220 are essentially similar to the spacers described by Stewart et al., cited supra. In other embodiments, the spacers 220 are essentially similar to the non-uniform spacers 120 described above with respect to the contact lithography apparatus 100. FIG. 5 illustrates an embodiment of the contact lithography apparatus 200 with non-uniform spacers 220, for example. FIG. 6 illustrates another embodiment of the contact lithography apparatus 200 with uniform spacers 220 and is described further below.

In some embodiments, a difference $\Delta$ in a height $h_1$ of the spacers 220 and a height $h_2$ of the mesa 240 extending beyond the mold 210 mean surface 218 is greater than a feature height $h_3$ of features defined on the patterned area 212 of the mold 210 (i.e., $\Delta > h_3$, where $\Delta = h_1 - h_2$). In some embodiments, the difference $\Delta$ is between about 0.5 μm and about 10 μm (i.e., ~10 μm $\geq \Delta \geq$ ~0.5 μm). In some embodiments, the difference $\Delta$ is between about 1 μm and about 2 μm (i.e., ~2 μm $\geq \Delta \geq$ ~1 μm). In some embodiments, the feature height $h_3$ ranges from about 30 nanometers (nm) to about 100 nm. For example, the feature height $h_3$ may equal about 60 nm, the mesa height $h_2$ may equal about 1.5 μm and the spacer height $h_1$ may equal about 2.5 μm, yielding a difference $\Delta$ equal to about 1 μm. When non-uniform spacers 220 are employed, the spacer height $h_1$ may be defined as a mean value of respective heights of the individual spacers 220. Alternatively, the spacer height $h_1$ may be defined as either a height of a tallest spacer 220 or a height of a shortest spacer 220, depending on a particular embodiment.

In some embodiments wherein the mold 210 comprises the mesa 240, the mesa 240 is integral to the mold 210. For example, the mesa 240 may be manufactured concomitant with the mold 210 from the same material and employing conventional fabrication methodologies used to form the mold 210. In other embodiments, the mesa 240 is provided separately from and attached to the mold 210. For example, the mesa 240 may be glued or otherwise affixed to the mold 210. In either case, the mesa 240 may comprise materials and may be fabricated essentially similarly to the mold 210, in some embodiments. In some embodiments, the mesa 240 serves to stiffen a portion of the mold 210 in a vicinity of the mesa 240.

FIG. 6 illustrates a cross sectional view of the contact lithography apparatus 200 during flexure-facilitated contact lithography according to another embodiment of the present invention. As illustrated in FIG. 6, the exemplary contact lithography apparatus 200 wherein the spacers 220 are uniform such that an initially parallel and proximal orientation of the mold 210 and the substrate 230 is provided through mutual contact. Further in FIG. 6, vertically oriented, large arrows directed toward a top surface of the mold 210 represent a deforming force applied to the mold 210.

As pressure is applied to the mold 210 by the deforming force, the mold 210 flexes toward the substrate 230. In some embodiments, the mesa 240 effectively stiffens the mold 210 in a vicinity of the mesa 240. As such, the mold 210 preferentially flexes in a region of the mold 210 lying outside an area encompassed by the mesa 240 (i.e., the patterned region 212 of the mold 210). Moreover, the stiffening action of the mesa 240 essentially maintains a parallel orientation of the patterned area 212 on the mesa 240 relative to that of the target area 232 of the substrate 230. In other words, the mesa 240 facilitates maintaining a parallel orientation of the contacting surfaces 214, 234 throughout the flexure-facilitated contact lithography once the parallel and proximal orientation has been established by the mutual contact between the mold 210, the spacers 220 and the substrate 230.

Not illustrated in FIG. 5 or 6 is the flexure-facilitated contact for the contact lithography apparatus 200 that comprises the non-uniform spacers 220 and the mesa 240. However, the embodiments of the contact lithography apparatus 100 illustrated in FIGS. 3B-3C, as well as FIG. 4B-4C, provide some examples of the flexure-facilitated contact that the contact lithography apparatus 200 would experience in some embodiments. These embodiments and other embodiments that might be similarly devised are within the scope of the present invention.

Figure 7A:
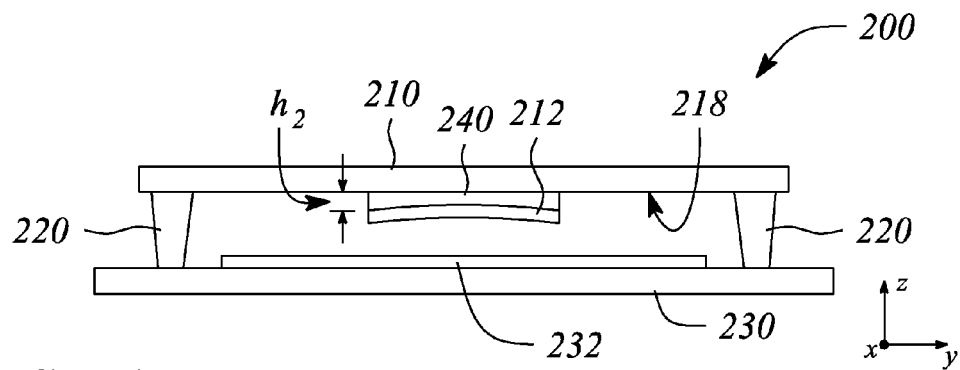
FIG. 7A illustrates a side view of a contact lithography apparatus according to another embodiment of the present invention.

FIG. 7A illustrates a side view of a contact lithography apparatus 200 according to another embodiment of the present invention. In particular, the contact lithography apparatus 200 illustrated in FIG. 7A comprises a non-uniform mesa 240 in that the mesa 240 has a non-uniform profile. By 'non-uniform profile' it is meant that the height $h_2$ of the non-uniform mesa 240 varies across a substrate-oriented surface of the mesa 240. In other words, the substrate-oriented surface of the non-uniform mesa 240 is not planar. Moreover, since the patterned area 212 of the mold 210 is attached to or otherwise formed on the substrate-oriented surface of the non-uniform mesa 240, the patterned area 212 takes on the non-uniform profile of the non-uniform mesa 240.

In some embodiments, the non-uniform profile of the mesa 240 may be shaped to better align the patterned area 212 and the target area 232 of the substrate 230 during flexure-facilitated contact lithography, for example (see FIG. 7B and the discussion below). FIG. 7A illustrates that the contact lithography apparatus 200 comprises the non-uniform mesa 240 with an exemplary concave-curved or semi-circular non-uniform profile. Such a curved surface may better match a curvature of the substrate 230 that is flexed by the deforming force to facilitate contact of the contacting surfaces 214, 234 in some embodiments.

Figure 7B:
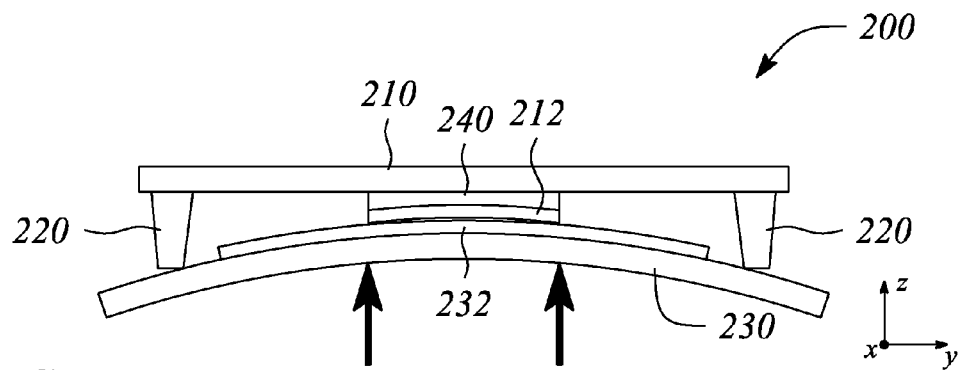
FIG. 7B illustrates a side view of the contact lithography apparatus illustrated in FIG. 7A during flexure-facilitated contact lithography according to an embodiment of the present invention.

FIG. 7B illustrates a side view of the contact lithography apparatus 200 illustrated in FIG. 7A during flexure-facilitated contact lithography according to an embodiment of the present invention. In FIG. 7B, an applied deforming force (large, vertical arrows) is applied to the substrate 230 to deform the substrate 230 toward the mold 210 in these embodiments. As illustrated in FIG. 7B, a curvature of the non-uniform mesa 240 essentially matches a curvature of the deformed substrate 230 just before contact is achieved between the contacting surfaces of the mold 210 and substrate 230.

Figure 8:
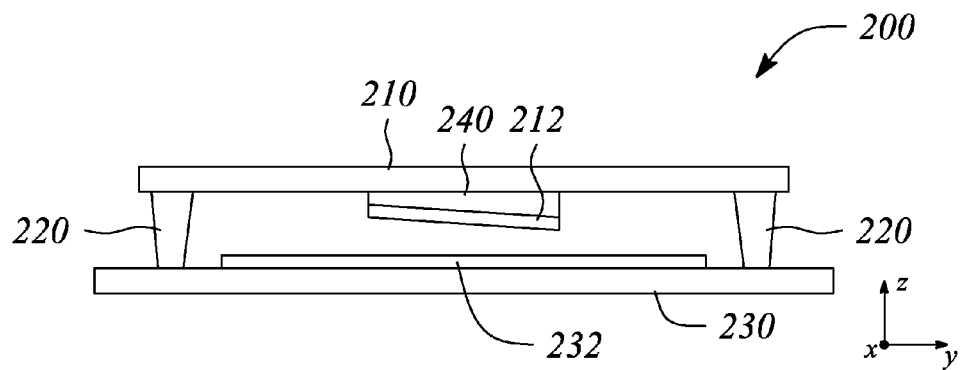
FIG. 8 illustrates a side view of a contact lithography apparatus according to another embodiment of the present invention.

FIG. 8 illustrates a side view of a contact lithography apparatus according to another embodiment of the present invention. As illustrated in FIG. 8, an exemplary non-uniform mesa 240 comprises a tapered profile. Such a tapered profile may facilitate one or both of gas evacuation and an application of a localized pressure in a manner essentially similar to that described above and illustrated in FIGS. 4A-4C with respect to the contact lithography apparatus 100, for example.

Figure 9:
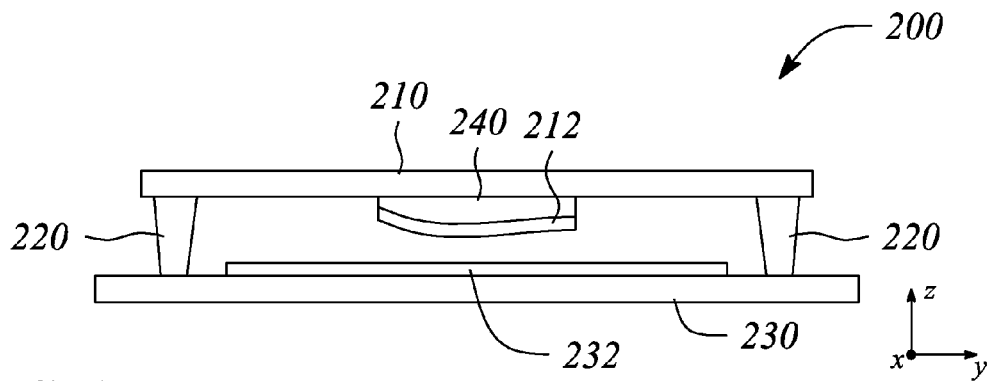
FIG. 9 illustrates a side view of a contact lithography apparatus according to another embodiment of the present invention.

FIG. 9 illustrates a side view of a contact lithography apparatus according to another embodiment of the present invention. As illustrated in FIG. 9, an exemplary non-uniform mesa 240 comprises a complex, mostly convex, curved, non-uniform profile. Such a complex, mostly convex, curved, non-uniform profile may facilitate one or both of gas evacuation/material flow and an application of a localized pressure in a manner essentially similar to that described above and illustrated in FIGS. 4A-4C with respect to the contact lithography apparatus 100, for example. Other shapes of the mesa 240 non-uniform profile are possible including, but not limited to, a shape that is adapted to a complex deformation shape of an opposing contacting surface either at contact or just before contact is achieved and a shape adapted to facilitate application of localized pressure during contact lithography. All such shapes of non-uniform profiles of the mesa 240 are within the scope of the various embodiments of the present invention.

Uniform spacers 220 are shown in the embodiments illustrated in FIGS. 8 and 9 by way of example and not by way of limitation. In other embodiments, non-uniform spacers 220 may be used, or a combination of non-uniform spacers 220 and uniform spacers 220 may be used, depending on the embodiment, and still be within the scope of the various embodiments of the present invention.

Figure 10:
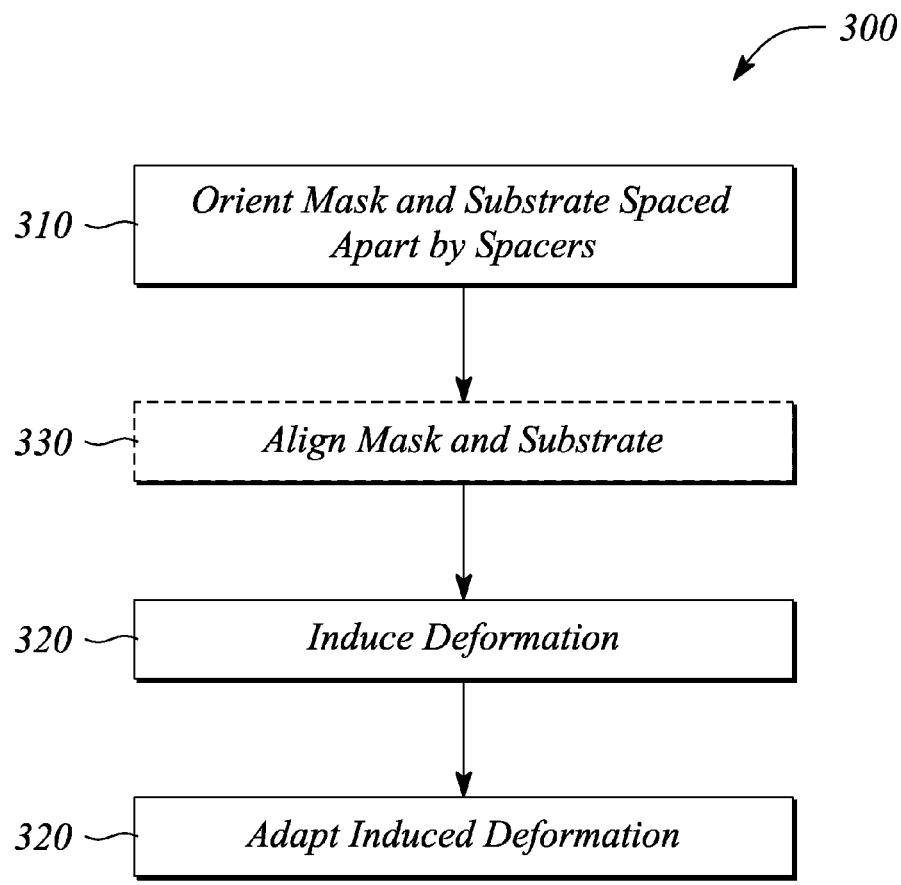
FIG. 10 illustrates a flow chart of a method of contact lithography according to an embodiment of the present invention.

FIG. 10 illustrates a flow chart of a method 300 of contact lithography according to an embodiment of the present invention. The method 300 comprises orienting 310 a patterning tool (i.e., mask, mold, lithographic template, etc.) and a substrate being patterned in a spaced apart relationship using spacers. A patterned portion of the patterning tool and a target portion of the substrate face each other in the orientation 310. The spacers initially prevent direct contact between the patterned portion of the patterning tool and the target portion of the substrate. In some embodiments, one of the patterning tool and the substrate has a mesa. When the patterning tool has a mesa, the patterned portion of the patterning tool is located on the mesa and the spaced apart relationship provided by the spacers further accommodates a height of the mesa.

For example, when oriented 310, a maximum feature height of the patterning tool is spaced apart from or clears a maximum feature height of the substrate. In some embodiments, during and after orienting 310, the spacers further provide and maintain an essentially parallel relationship between the patterning tool and the substrate. For example, a planar surface of the patterning tool is made to be essentially parallel to a planar surface of the substrate by a relative spacing dimension (e.g., diameter or height) of the spacers during and after orienting 310. In other embodiments, the spacers provide non-uniform spacing. With non-uniform spacing, an essentially non-parallel relationship between the patterning tool and substrate is provided and maintained during orienting 310.

The method 300 further comprises inducing 320 deformation of one or more of the patterning tool, the substrate and the spacers, such that the patterned portion of the patterning tool and the target portion of the substrate are brought into direct contact. Inducing 320 deformation comprises one or more of flexing the patterning tool in a direction toward the substrate, flexing the substrate in a direction toward the patterning tool, and deforming or collapsing the spacers.

The induced 320 deformation facilitates moving one or both of a portion of the patterning tool and a portion of the substrate across a space created by the spacers during orienting 310. The facilitated movement brings the respective patterning tool portion in direct contact with the respective substrate portion. In some embodiments, the patterning tool is a lithographic mask employed in photolithographic patterning of the substrate while the mask is in the direct contact with the substrate or a pattern receiving layer of the substrate (e.g., optical contact lithography, X-ray contact lithography, etc.). In other embodiments, the patterning tool is a mold employed in printing or impressing a pattern onto a pattern receiving surface of the substrate during the direct contact (e.g., imprint lithography or nano-imprint lithography). The direct contact resulting from the induced 320 deformation transfers a copy of the lithographic pattern to the substrate.

The method 300 further comprises adapting 330 the induced deformation using one or both of non-uniform spacers and a non-uniform mesa. In some embodiments, adapting 330 essentially pre-bends one or both of the patterning tool and the substrate through an interaction between the patterning tool, the substrate and a plurality of sets of non-uniform spacers. The pre-bending may comprise a flattening of a contacting surface in a vicinity of the transferred pattern. For example, adapting 330 using a plurality of sets of non-uniform spacers may comprise providing a first set of non-uniform spacers and a second set of non-uniform spacers, the first set being taller than the second set. Adapting 330 may further comprise pre-bending the patterning tool around the first set by applying a deforming force to a center portion of the patterning tool. Adapting 330 may further comprise flattening the patterning tool by applying an addition deforming force such that the patterning tool contacts and is further deformed by the second set. Using non-uniform spacers to adapt 330 an induced deformation by pre-bending and flattening is discussed further above with respect to FIGS. 3A-3C.

In other embodiments, adapting 330 essentially provides an initial point of contact between the contacting surfaces wherein the initial point of contact has an area that is substantially less than an area of the pattern being transferred. In these other embodiments, adapting 330 further provides for one or both of gas evacuation from between the patterning tool and the substrate and localized higher contact pressure in a vicinity of the initial contact point as the additional deforming force is applied. For example, a non-uniform mesa with a localized raised area may be used to establish an initial contact point between the patterning tool and the substrate (see FIG. 3B, for example). In another example, a spacer that is shorter than another spacer (i.e., non-uniform relative to each other) may similarly produce an initial contact point (see FIG. 4B, for example). Formation of initial contact points using one or both non-uniform spacers and the non-uniform mesa are discussed above with respect to FIGS. 4A-4C and FIGS. 8-9, and is also illustrated in FIG. 3C, for example.

In some embodiments, the method 300 of contact lithography optionally further comprises aligning 340 the patterning tool and the substrate following orienting 310 but prior to inducing 320 deformation. Performing an alignment 340 comprises one or both of lateral alignment and rotational alignment of one or both of the patterning tool and the substrate relative to each other. In such embodiments, aligning 340 comprises moving one or both of the patterning tool and the substrate on an interface with the spacers, such as by sliding on an interface surface of the spacers. The interface between the spacers and one or both of the patterning tool and the substrate is characteristically slideable to facilitate sliding.

Thus, there have been described embodiments of an apparatus and a method of contact lithography that employ one or both of spacers and a mesa and flexure in the apparatus to achieve a patterning tool/substrate contact. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A contact lithography apparatus comprising:
   a patterning tool having a patterned area with a lithographic pattern; and
   a plurality of non-uniform spacers disposed between the patterning tool and a substrate being patterned, the plurality of non-uniform spacers being configured to provide a spaced apart and proximal orientation of the patterning tool and the substrate when the patterning tool and the substrate are in mutual contact with the plurality of non-uniform spacers,
   wherein one or more of the patterning tool, the substrate and is a spacer of the plurality of non-uniform spacers is deformable, such that a deformation facilitates lithographic pattern transfer.

2. The contact lithography apparatus of claim 1, wherein the non-uniform spacers comprise:
   a first set of spacers; and
   a second set of spacers,
   wherein the first set has a spacing distance that is larger than a spacing distance of the second set.

3. The contact lithography apparatus of claim 2, wherein the deformation comprises pre-bending and deforming, the first set of spacers facilitating pre-bending of one or both of the patterning tool and the substrate during contact lithography.

4. The contact lithography apparatus of claim 3, wherein a pre-bent one or both of the patterning tool and the substrate further deforms against the second set of spacers, the further deformed one of the patterning tool and the substrate comprising a flattened contact surface that facilitates pattern transfer.

5. The contact lithography apparatus of claim 1, wherein the non-uniform spacers have spacing dimensions that initially create a non-uniform space between the patterning tool and the substrate.

6. The contact lithography apparatus of claim 5, wherein the non-uniform space during deformation and pattern transfer facilitates one or more of gas evacuation from between respective contacting surfaces of the patterning tool and the substrate, application of localized pressure between the respective contacting surfaces upon contact, and preferential flow of a pattern receiving layer material resulting from the contact.

7. The contact lithography apparatus of claim 1, further comprising a mesa on one or both of the patterning tool and the substrate, the mesa respectively comprising one or both of the patterned area of the patterning tool and a target area of the substrate, the mesa being present prior to the deformation that facilitates lithographic pattern transfer.

8. The contact lithography apparatus of claim 7, wherein the mesa is a non-uniform mesa.

9. The contact lithography apparatus of claim 7, wherein the mesa stiffens a respective portion of one or both of the patterning tool and the substrate such that deformation preferentially occurs beyond a periphery of the mesa.

10. The contact lithography apparatus of claim 1, wherein one or both of the patterning tool and the substrate comprises the non-uniform spacers, the non-uniform spacers being fabricated as an integral part of one or both of the patterning tool and the substrate.

11. The contact lithography apparatus of claim 1, further comprising means for causing the deformation that provides a contact pressure, wherein the means for causing the deformation is one or more of a pressure, an electromagnetic force, and a temperature change.

12. A contact lithography apparatus comprising:
    a patterning tool having a patterned area with a lithographic pattern;
    a substrate having a target portion that receives the lithographic pattern;
    a mesa on one or both of the patterning tool and the substrate, the mesa supporting a respective one or both of the patterned area and the target portion, the mesa being present prior to a deformation associated with lithographic pattern transfer; and
    spacers disposed between and providing a spaced apart orientation of the patterning tool and the substrate when the patterning tool and the substrate are in mutual contact with the spacers,
    wherein one or both of the patterning tool and the substrate is deformable to facilitate transfer of the lithographic pattern.

13. The contact lithography apparatus of claim 12, wherein the mesa stiffens a respective portion of one or both of the patterning tool and the substrate such that deformation preferentially occurs beyond a periphery of the mesa.

14. The contact lithography apparatus of claim 12, wherein the mesa comprises a non-uniform mesa, the non-uniform mesa comprising a non-uniform surface profile.

15. The contact lithography apparatus of claim 12, wherein one or both of the mesa is a non-uniform mesa and the spacers are non-uniform spacers.

16. The contact lithography apparatus of claim 15, wherein either or both of the non-uniform mesa and the non-uniform spacers facilitate during deformation and pattern transfer one or more of a preferential flow of a pattern receiving layer material and a gas evacuation from between the patterned area and the target portion and an application of localized pressure in a vicinity of a contact point between the patterned area and target portion.

17. A contact lithography apparatus comprising:
    a patterning tool having a patterned area with a lithographic pattern; and
    a plurality of non-uniform spacers disposed between the patterning tool and a substrate being patterned, the plurality of non-uniform spacers being configured to provide a substantially non-parallel, spaced apart and proximal orientation of the patterning tool and the substrate when the patterning tool and the substrate are in mutual contact with the plurality of non-uniform spacers, wherein one or more of the patterning tool, the substrate and a spacer of the plurality of non-uniform spacers is deformable, such that a deformation facilitates lithographic pattern transfer, the plurality of non-uniform spacers having spacing dimensions that initially create the substantially non-parallel orientation.

18. The contact lithography apparatus of claim 17, wherein the non-parallel orientation during deformation and pattern transfer facilitates one or more of gas evacuation from between respective contacting surfaces of the patterning tool and the substrate, application of localized pressure between the respective contacting surfaces upon contact, and preferential flow of a pattern receiving layer material resulting from the contact.

19. The contact lithography apparatus of claim 17, further comprising a mesa on one or both of the patterning tool and the substrate, the mesa respectively comprising one or both of the patterned area of the patterning tool and a target area of the substrate.

20. The contact lithography apparatus of claim 17, further comprising means for causing the deformation that provides a contact pressure, wherein the means for causing the deformation is one or more of a pressure, an electromagnetic force, and a temperature change.

* * * * *

UNITED STATES PATENT AND TRADEMARK OFFICE
CERTIFICATE OF CORRECTION

| | |
|---|---|
| PATENT NO. | : 7,768,628 B2 |
| APPLICATION NO. | : 11/548823 |
| DATED | : August 3, 2010 |
| INVENTOR(S) | : Wei Wu et al. |

It is certified that error appears in the above-identified patent and that said Letters Patent is hereby corrected as shown below:

In column 17, line 36, in Claim 1, after "and" delete "is".

Signed and Sealed this
Twentieth Day of December, 2011

David J. Kappos
*Director of the United States Patent and Trademark Office*